US011710631B2

(12) United States Patent
Tsiang et al.

(10) Patent No.: US 11,710,631 B2
(45) Date of Patent: Jul. 25, 2023

(54) TENSILE NITRIDE DEPOSITION SYSTEMS AND METHODS

(71) Applicant: Applied Materials, Inc., Santa Clara, CA (US)

(72) Inventors: Michael Wenyoung Tsiang, Milpitas, CA (US); Yichuen Lin, Hsinchu (TW); Kevin Hsiao, ZhuBei (TW); Hang Yu, San Jose, CA (US); Deenesh Padhi, Sunnyvale, CA (US); Yijun Liu, Santa Clara, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 17/078,793

(22) Filed: Oct. 23, 2020

(65) Prior Publication Data

US 2022/0130661 A1     Apr. 28, 2022

(51) Int. Cl.
*H01L 21/02* (2006.01)
*C23C 16/34* (2006.01)
*C23C 16/505* (2006.01)

(52) U.S. Cl.
CPC ........ *H01L 21/0234* (2013.01); *C23C 16/345* (2013.01); *C23C 16/505* (2013.01);
(Continued)

(58) Field of Classification Search
None
See application file for complete search history.

(56) References Cited

U.S. PATENT DOCUMENTS

| 7,294,553 B2 | 11/2007 | Vogt |
| 2007/0141852 A1* | 6/2007 | Stapelmann ........ H01L 21/0228 257/E21.549 |

(Continued)

FOREIGN PATENT DOCUMENTS

KR    2013-0050918 A    5/2013

OTHER PUBLICATIONS

International Search Report and Written Opinion dated Feb. 15, 2022 in International Patent Application No. PCT/US2021/055628, 9 pages.

*Primary Examiner* — Asok K Sarkar
(74) *Attorney, Agent, or Firm* — Kilpatrick Townsend & Stockton LLP (57) ABSTRACT

Exemplary semiconductor processing methods may include flowing deposition gases that may include a nitrogen-containing precursor, a silicon-containing precursor, and a carrier gas, into a substrate processing region of a substrate processing chamber. The flow rate ratio of the nitrogen-containing precursor to the silicon-containing precursor may be greater than or about 1:1. The methods may further include generating a deposition plasma from the deposition gases to form a silicon-and-nitrogen containing layer on a substrate in the substrate processing chamber. The silicon-and-nitrogen-containing layer may be treated with a treatment plasma, where the treatment plasma is formed from the carrier gas without the silicon-containing precursor. The flow rate of the carrier gas in the treatment plasma may be greater than a flow rate of the carrier gas in the deposition plasma.

20 Claims, 4 Drawing Sheets

(52) U.S. Cl.
CPC .... *H01L 21/0217* (2013.01); *H01L 21/02211* (2013.01); *H01L 21/02274* (2013.01)

(56) References Cited

U.S. PATENT DOCUMENTS

2009/0155606 A1 6/2009 Yoon et al.
2012/0196450 A1 8/2012 Balseanu et al.
2014/0023784 A1 1/2014 Fox \* cited by examiner

TENSILE NITRIDE DEPOSITION SYSTEMS AND METHODS

TECHNICAL FIELD

The present technology relates to semiconductor systems and processes. More specifically, the present technology relates to deposition systems and methods in which a tensile silicon nitride layer may be formed.

BACKGROUND

Integrated circuits are made possible by processes which produce intricately patterned material layers on substrate surfaces. Producing patterned material on a substrate requires controlled methods of formation and removal of exposed material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology include systems and methods to form a tensile silicon nitride layer on a substrate. In some embodiments, the tensile nitride layer may act as an etch stop layer, CMP stop layer, or hardmask layer in a front-end-of-line or middle-end-of-line semiconductor fabrication process. The high tensile stress of the nitride layer may reduce the line edge roughness (LER) and line width roughness (LWR) of holes, channels, trenches, and other types of openings formed in one or more patterning layers deposited on or below the tensile nitride layer. The need for these precisely patterned openings increases as the critical dimensions of semiconductor device structures, such as nMOS transistors, continue to decrease.

Embodiments of the present technology include semiconductor processing methods that may include flowing deposition gases comprising a nitrogen-containing precursor, a silicon-containing precursor, and a carrier gas, into a substrate processing region of a substrate processing chamber. The flow rate ratio of the nitrogen-containing precursor to the silicon-containing precursor may be greater than or about 1:1. The methods may further include generating a deposition plasma from the deposition gases to form a silicon-and-nitrogen containing layer on a substrate in the substrate processing chamber. The silicon-and-nitrogen-containing layer may be treated with a treatment plasma, where the treatment plasma is formed from the carrier gas without the silicon-containing precursor. The flow rate of the carrier gas in the treatment plasma may be greater than a flow rate of the carrier gas in the deposition plasma.

In exemplary embodiments, the nitrogen-containing precursor may include ammonia, and the silicon-containing precursor may include silane. The nitrogen-containing precursor may be characterized by a flow rate that is greater than or about 100 sccm, and the silicon-containing precursor may be characterized by a flow rate that is greater than or about 50 sccm. In additional embodiments, the carrier gas may include at least one of molecular nitrogen ($N_2$) and argon. The molecular nitrogen in the carrier gas may be characterized by a flow rate greater than or about 5000 sccm, and the argon in the carrier gas may be characterized by a flow rate greater than or about 2000 sccm. In still additional embodiments, the processing chamber may be characterized by a deposition chamber pressure during the deposition of the silicon-and-nitrogen-containing layer that is less than the treatment chamber pressure during the treating of the silicon-and-nitrogen-containing layer. In further embodiments, the deposition plasma may be generated by delivering to the deposition gases a plasma power of less than or about 60 Watts. In still further embodiments, the treatment plasma may be generated by delivering to the carrier gas without the silicon-containing precursor a plasma power of greater than or about 100 Watts.

In further exemplary embodiments, the silicon-and-nitrogen-containing layer may be formed at a deposition rate less than or about 10 Å/second. In still further embodiments, the processing method may produce a post-treatment silicon-and-nitrogen-containing layer that is a silicon nitride layer characterized by a tensile stress of greater than or about 1 GPa, and a wet etch rate less than or about 20 Å/minute.

Embodiments of the present technology may also include semiconductor processing methods that include depositing a silicon-and-nitrogen-containing layer on a substrate in a substrate processing region of a substrate processing chamber. The silicon-and-nitrogen-containing layer may be deposited with a deposition plasma generated at a first plasma power from a deposition gas that includes a nitrogen-containing precursor and a silicon-containing precursor. In some embodiments, a flow rate ratio of the nitrogen-containing precursor to the silicon-containing precursor is greater than or about 1:1. In additional embodiments, the silicon-and-nitrogen-containing layer may be formed at a deposition rate less than or about 10 Å/second. The method may further include treating the silicon-and-nitrogen-containing layer with a treatment plasma. The treatment plasma may be formed with a second plasma power that is greater than the first plasma power. The processing method may produce the silicon-and-nitrogen-containing layer that is characterized by a tensile stress greater than or about 1 GPa, and a wet etch rate less than or about 20 Å/minute.

In exemplary embodiments, the treatment plasma may be formed from a treatment gas without the silicon-containing precursor or the nitrogen-containing precursor. In further embodiments, the treatment plasma may be formed from a treatment gas that includes molecular nitrogen ($N_2$). In still further embodiments, the molecular nitrogen may be delivered to the semiconductor processing chamber at a nitrogen flow rate greater than or about 10,000 sccm. The processing method may produce the silicon-and-nitrogen-containing layer that is a silicon nitride layer characterized by less than or about 3 at. % hydrogen.

Embodiments of the present technology include semiconductor processing methods that may include forming a silicon nitride layer in two or more cycles that may include depositing a portion of a silicon nitride layer on a substrate in a substrate processing region of a substrate processing chamber, and treating the portion of the silicon nitride layer with a treatment plasma. The portion of the silicon nitride layer may be deposited to a thickness less than or about 15 Å. In some embodiments, each portion of the silicon nitride layer may be formed at a deposition rate of less than or about 10 Å/second. In additional embodiments, the treating operation for each portion of as-deposited silicon nitride layer may occur for less than or about 15 seconds. The treatment plasma may increases the tensile stress and wet etch rate of the treated portion of the silicon nitride layer compared to the as-deposited portion. The treated portion of the silicon nitride layer may also be characterized by a hydrogen level less than or about 3 at. %.

In exemplary embodiments, portions of the silicon nitride layer may be deposited from a deposition plasma that is generated from deposition gases delivered to the substrate processing chamber. The deposition gases may include a nitrogen-containing precursor and a silicon-containing precursor. In some embodiments, the nitrogen containing precursor may be characterized by a flow rate less than or about 200 sccm, and the silicon-containing precursor may be characterized by a flow rate less than 100 sccm. The processing method may produce a silicon nitride layer that is characterized by a tensile stress greater than or about 1 GPa, and a wet etch rate less than or about 20 Å/minute.

Such technology may provide numerous benefits over conventional systems and methods of forming silicon nitride layers. For example, in embodiments where the flow rate of the carrier gas is increased when transitioning from deposition to treatment operations, the tensile stress in the treated silicon-and-nitrogen-containing material deposited on the substrate may be increased by a greater amount, and in a shorter period, than observed in conventional deposition-treatment methods. Additionally, in embodiments where the amount of treatment plasma power to generate the treatment plasma is greater than the amount of deposition plasma power to generate the deposition plasma, the final tensile stress level in the silicon-and-nitrogen-containing material may also be increased. In further embodiments, the present technology may produce silicon-and-nitrogen containing layers with less atomic percentage hydrogen than observed in conventional deposition-treatment methods. The lower atomic percentage hydrogen may further increase the tensile stress level and reduce the wet etch rate of the silicon-and-nitrogen containing layer. Embodiments of the present technology, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes embodiments of systems and processing methods to form a tensile silicon nitride layer on a semiconductor substrate. Among other functions, these tensile nitride layers address difficulties in forming increasingly precise channels, contacts, vias, trenches, and other types of openings in patterning materials on the substrate. Conventional, low-stress nitride layers positioned between the patterning materials and the semiconductor materials of the substrate lack the forces that keep the sidewalls of the patterned opening highly aligned and smooth. Consequently, patterning operations with these low-stress nitride layers produce rough openings that are characterized by large line edge roughness (LER) and line width roughness (LWR) along the sidewalls formed in the pattering material between a patterned photoresist layer and the nitride etch stop layer, or due to distortions in the hardmask dimensions. As the critical dimensions of semiconductor devices, such as nMOS transistors, continue to decrease, the amount of roughness in these openings becomes a larger problem. The degree of roughness in these conventionally formed openings increasingly exceeds the tolerances of the critical dimensions of substrate features that are required for a stable, functioning integrated circuit.

One approach to decreasing the roughness in these openings is to form them on silicon nitride layers with increased tensile stress. The increased tensile stress enhances the characteristics of the adjacent patterning materials that reduce the tendency of the materials to etch at an uneven rate in lateral directions. The openings formed in the patterned materials are characterized by a reduced line edge roughness (LER) and line width roughness (LWR) along their sidewalls. Unfortunately, forming a silicon nitride layer with increased tensile stress is generally more difficult than forming a conventional, low-stress nitride layer. Tensile stress may be increased in nitride layers deposited with plasma-enhanced chemical vapor deposition of silicon-nitrogen-and-hydrogen containing precursors by decreasing the number of Si—H and N—H bonds in the as-deposited nitride layer, and increasing the number of Si—N bonds. The decreased number of Si—H and N—H bonds may result from the removal of hydrogen from the as-deposited layer. As Si and N atoms encroach into the spaces left by the removed hydrogen atoms and form more Si—N bonds, the overall tensile stress in the nitride layer increases. The added difficulty in forming a high-tensile-stress nitride layer is the extra operations to remove the hydrogen atoms from the as-deposited layer.

One approach to treating an as-deposited silicon nitride layer to increase its tensile stress is to expose the as-deposited layer to ultraviolet light. Unfortunately, UV-treatments can have several drawbacks, including low penetration of the UV light through the as-deposited layer, and the additional equipment required to generate and focus the light on the substrate. In many instances, it is impractical to incorporate the UV treatment equipment in the nitride deposition chamber, and substrates with the as-deposited nitride material must be transferred to a separate chamber for the UV treatment. Because the UV treatment equipment is generally designed to penetrate less than or about 5-10 Å of the as-deposited nitride, a substrate may be shuttled back and forth between the nitride deposition and UV treatment chambers many times to fabricate an entire layer. This can significantly increase the time and complexity to form a tensile silicon nitride layer on a substrate using UV treatment operations.

Embodiments of the present technology address these and other problems with conventional systems and methods of forming tensile silicon-and-nitrogen-containing layers by depositing and treating a silicon-and-nitrogen-containing layer on a substrate in a single processing chamber. Embodiments of the processing methods may include increasing a flow rate of a carrier gas between depositing the less-stressed silicon-and-nitrogen-containing layer on the substrate and treating the as-deposited nitride with a treatment plasma to form a tensile-stressed silicon-and-nitrogen-containing layer having greater than or about 1 GPa of tensile stress. In these embodiments, the flow rates of one or more deposition precursors may be reduced or stopped while the flow rate of a carrier gas included with the deposition precursors is increased. In some embodiments, the carrier gas may flow continuously into the processing chamber during the deposition and treatment operations, and the carrier gas flow rate may not drop below an initial flow rate during the deposition operation until the treatment operation is completed. In embodiments where there is an increase in the carrier gas flow rate between the deposition and treatment operations, the tensile stress in the treated silicon-and-nitrogen-containing layer may be increased by a greater amount, and in a shorter period, than observed in conventional deposition-treatment methods.

In additional embodiments of the processing methods, the plasma power may be increased in a transition from a deposition plasma that deposits the silicon-and-nitrogen-containing layer to a treatment plasma that increases the tensile stress in the layer. In some embodiments, the plasma power may be uninterrupted during the transition from the deposition to the treatment plasma. This may reduce the time for each dep-treat cycle to form the tensile-stressed, silicon-and-nitrogen-containing layer. In embodiments where several dep-treat cycles are performed to complete the formation of the layer, the cumulative reduction in processing time can be substantial. In further embodiments, the increase in plasma power may also increase the tensile stress in the fully-formed silicon-and-nitrogen-containing layer.

In still additional embodiments of the present technology, the tensile silicon-and-nitrogen containing layers produced by embodiments of the systems and methods may have a reduced hydrogen content compared to tensile layers made by conventional methods. In embodiments, the tensile silicon-and-nitrogen containing layers may have less than or about 3 at. % atomic hydrogen. The low levels of hydrogen in the silicon-and-nitrogen containing layers may decrease the number of Si—H and N—H bonds in the layers while increasing the number of Si—N bonds. In embodiments, the increased molar ratio of Si—N bonds to Si—H and N—H bonds may increase the amount of tensile stress in the layers. In further embodiments, the increased molar ratio may also decrease the wet etch rate of the silicon-and-nitrogen containing layers, which, in some embodiments, makes them more effective as etch stop layers or hardmasks in semiconductor fabrication processes.

After describing general aspects of a chamber configured to perform operations according to embodiments of the present technology in which plasma processing may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

Figure 1A:
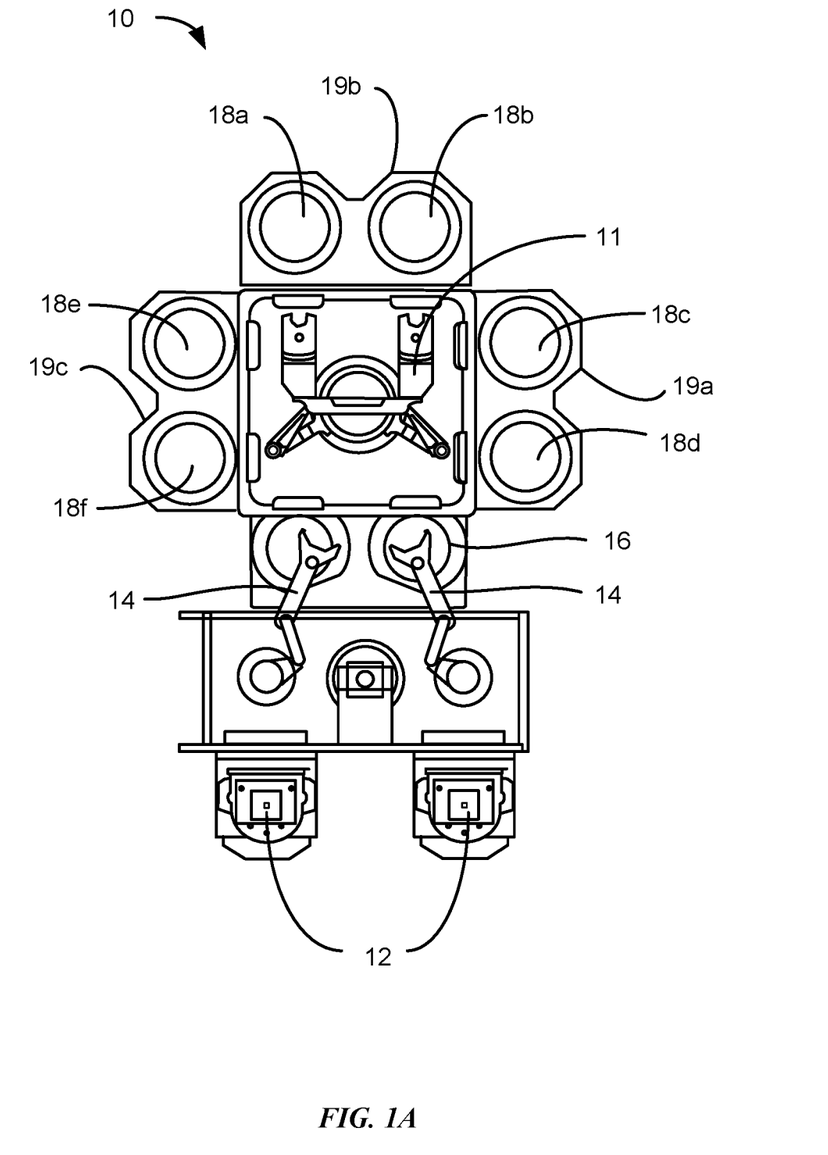
FIG. 1A shows a top plan view of an exemplary processing system according to some embodiments of the present technology.

FIG. 1A shows a top plan view of one embodiment of a processing system 10 of deposition, treating, etching, baking, and curing chambers according to embodiments. In the figure, a pair of front opening unified pods 12 supply substrates of a variety of sizes that are received by robotic arms 14 and placed into a low pressure holding area 16 before being placed into one of the substrate processing chambers 18*a-f*, positioned in tandem sections 19*a-c*. A second robotic arm 11 may be used to transport the substrate wafers from the holding area 16 to the substrate processing chambers 18*a-f* and back. Each substrate processing chamber 18*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, plasma treatments, annealing, ashing, etc.

The substrate processing chambers 18*a-f* may include one or more system components for depositing, plasma treating, curing and/or etching a dielectric or other film on the substrate. In one configuration, two pairs of the processing chambers, e.g., 18*c-d* and 18*e-f*, may be used to deposit dielectric material on the substrate, and the third pair of processing chambers, e.g., 18*a-b*, may be used to treat the deposited dielectric. In another configuration, all three pairs of chambers, e.g., 18*a-f*, may be configured to deposit and treat stacks of alternating dielectric films on the substrate. Any one or more of the processes described may be carried out in chambers separated from the fabrication system shown in different embodiments. It will be appreciated that additional configurations of deposition, treating, etching, annealing, and curing chambers for dielectric films are contemplated by system 10.

Figure 1B:
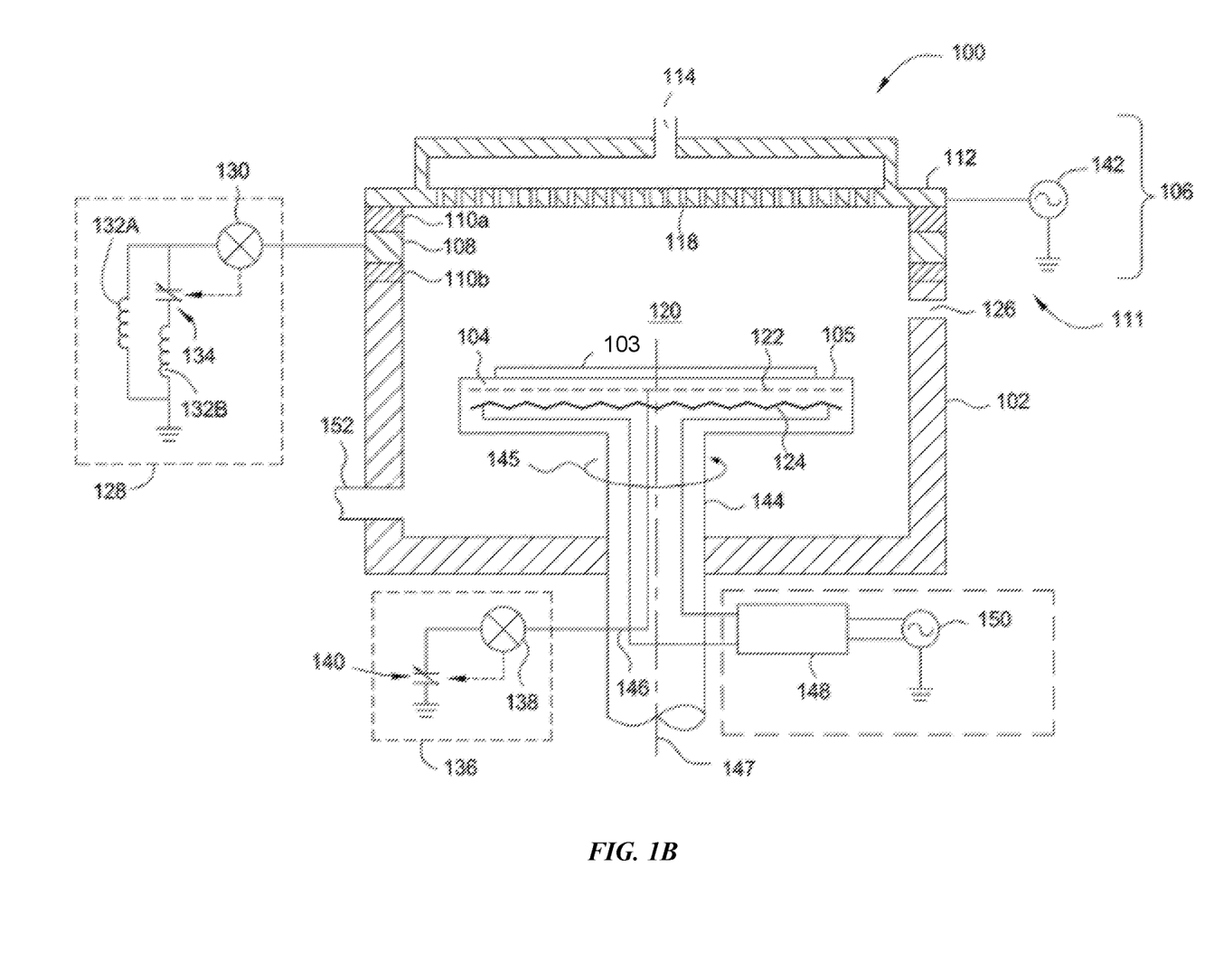
FIG. 1B shows a schematic cross-sectional view of an exemplary processing system according to some embodiments of the present technology.

FIG. 1B shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form tensile nitride films according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1B may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
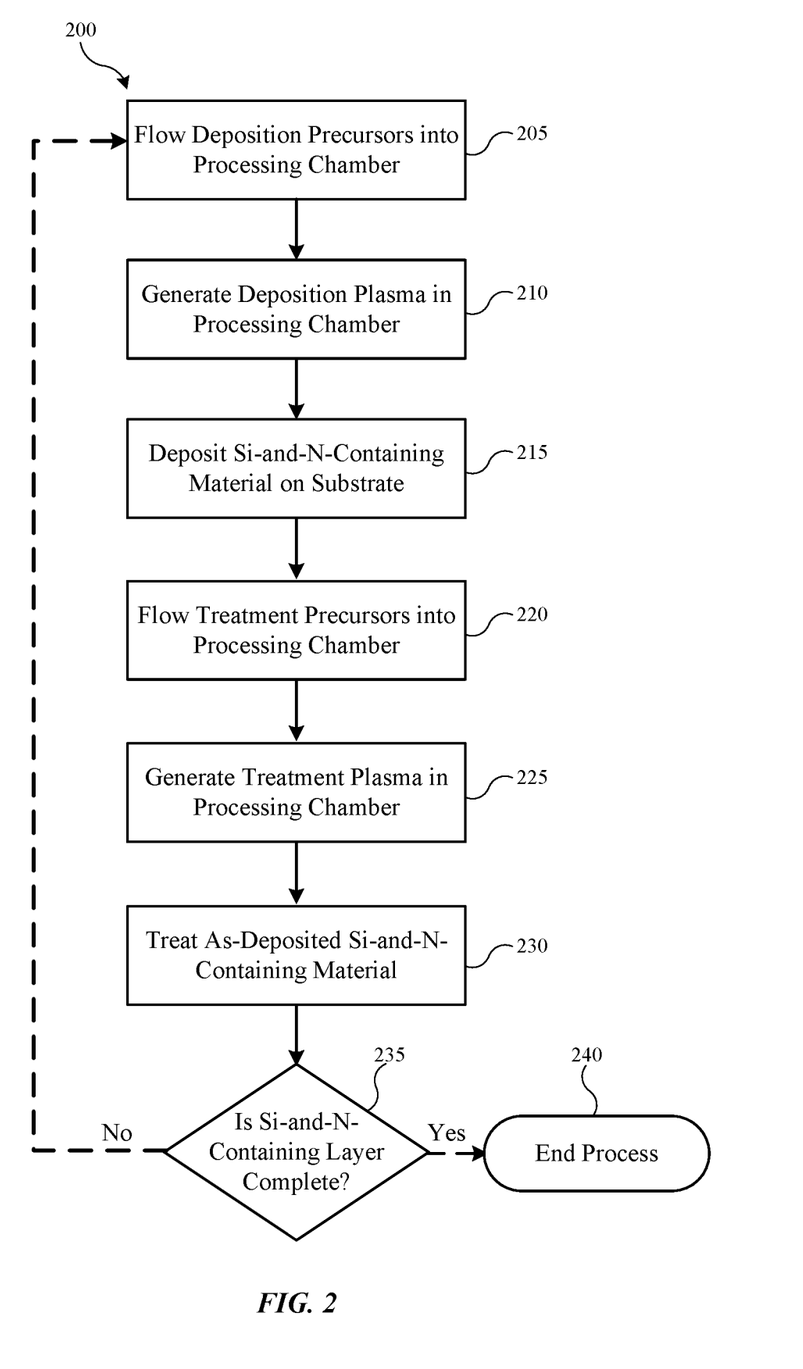
FIG. 2 shows operations of an exemplary method of semiconductor processing according to some embodiments of the present technology.

FIG. 2 shows exemplary operations in a deposition method 200 according to some embodiments of the present technology. The method may be performed in a variety of processing chambers, including processing chamber 100 described above. The method may include performing a purge operation subsequent deposition, which may limit particle deposition on substrates. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

Embodiments of processing method 200 to form a tensile silicon-and-nitrogen-containing layer may include flowing deposition precursors into a substrate processing region of a substrate processing chamber 205. Embodiments of the deposition precursors may include at least one silicon-containing precursor and at least one nitrogen-containing precursor. Embodiments of silicon-containing precursors may include silane, and disilane, among other silicon containing precursors. Embodiments of nitrogen-containing precursors may include ammonia ($NH_3$), and mixtures of molecular nitrogen and hydrogen ($N_2+H_2$), among other nitrogen-containing precursors. In further embodiments, the deposition precursors may also include at least one carrier gas. Embodiments of carrier gases may include molecular nitrogen ($N_2$) and argon, among other carrier gases.

In some embodiments, the nitrogen-containing deposition precursor may be introduced to the substrate processing region of the processing chamber at a flow rate greater than or about the flow rate of the silicon-containing deposition precursor. For example, a flow rate ratio of the nitrogen-containing precursor to the silicon-containing precursor may be greater than or about 1:1, greater than or about 2:1, greater than or about 3:1, greater than or about 4:1, greater than or about 5:1, or more. In additional examples, the flow rate ratio of the nitrogen-containing precursor to the silicon-containing precursor may be silicon rich. In embodiments, the flow rate ratio of the nitrogen-containing precursor to the silicon-containing precursor may be less than or about 1:5, less than or about 1:10, or less. In further embodiments, deposition carrier gases may be introduced to the substrate processing region of the processing chamber at a flow rate greater than the combined flow rates of the nitrogen-containing and silicon-containing deposition precursors. For example, a flow rate ratio of the carrier gases to the nitrogen-containing and silicon-containing precursors may be greater than or about 30:1, greater than or about 40:1, greater than or about 50:1, greater than or about 60:1, greater than or about 70:1, or more.

In embodiments, a flow rate of the one or more nitrogen-containing deposition precursors may be greater than or about 100 sccm, greater than or about 125 sccm, greater than or about 150 sccm, greater than or about 175 sccm, greater than or about 200 sccm, greater than or about 225 sccm, greater than or about 250 sccm, or more. In further embodiments, a flow rate of the one or more silicon-containing deposition precursors may be less than or about 100 sccm, less than or about 90 sccm, less than or about 80 sccm, less than or about 70 sccm, less than or about 60 sccm, less than or about 50 sccm, less than or about 40 sccm, or less. In still further embodiments, a flow rate for the carrier gases may be greater than or about 8000 sccm, greater than or about 9000 sccm, greater than or about 10,000 sccm, greater than or about 11,000 sccm, greater than or about 12,000 sccm, or more. In additional embodiments, the flow of the deposition precursors into the substrate processing chamber may increase the pressure in the chamber. In embodiments, the pressure in the substrate chamber during the flow of deposition precursors may be characterized as greater than or about 1 Torr, greater than or about 2 Torr, greater than or about 3 Torr, greater than or about 4 Torr, greater than or about 5 Torr, greater than or about 6 Torr, greater than or about 7 Torr, or more.

Embodiments of processing method 200 may further include generating a deposition plasma in the substrate processing region of the processing chamber 210. The deposition plasma may be generated by delivering plasma power to the deposition precursors that have flowed into the substrate processing region. In some embodiments, the plasma power may be delivered by a source of radio frequency (RF) power that is electrically coupled to at least one electrode within the processing chamber. In embodiments, the RF power source may deliver power to the at least one electrode, which creates an electric field in the substrate processing region of the processing chamber that energizes the deposition precursors to form the deposition plasma. In further embodiments, the plasma power delivered to the deposition precursors may be less than or about 60 Watts, less than or about 55 Watts, less than or about 50 Watts, less than or about 45 Watts, less than or about 40 Watts, less than or about 35 Watts, less than or about 30 Watts, or less. In still further embodiments, the frequency of the RF power delivered to the deposition precursors may be 13.56 MHz in one non-limiting example. In some embodiments, the plasma power delivered to the deposition precursors may be supplied continuously, while in additional embodiments, the plasma power may be pulsed. In pulsed embodiments, the delivered RF plasma power may have a pulsing frequency that may be less than or about 10 kHz, and may be less than or about 9 kHz, less than or about 8 kHz, less than or about 7 kHz, less than or about 6 kHz, less than or about 5 kHz, less than or about 4 kHz, less than or about 3 kHz, less than or about 2 kHz, less than or about 1 kHz, or less. In some pulsed embodiments, the off portion of the plasma power's duty cycle may allow more diffusion of the plasma effluents in the as-deposited silicon-and-nitrogen-containing material. In further embodiments, the longer diffusion time for the plasma effluents may form a more uniform as-deposited material.

Embodiments of processing method 200 may further include depositing a silicon-and-nitrogen containing material on the substrate in the substrate processing chamber from the deposition plasma 215. In some embodiments, the as-deposited silicon-and-nitrogen-containing material may be silicon nitride. In additional embodiments, the as-deposited silicon-and-nitrogen-containing material may be characterized by an amount of incorporated hydrogen. In embodiments, the amount of incorporated hydrogen in the as-deposited material may be greater than or about 5 at. %, greater than or about 6 at. %, greater than or about 7 at. %, greater than or about 8 at. %, greater than or about 9 at. %, greater than or about 10 at. %, or more. The large amounts of incorporated hydrogen in the as-deposited silicon-and-nitrogen-containing material may contribute to the deposition of a low-stress material. In some embodiments, the as-deposited silicon-and-nitrogen-containing material may have tensile stress that is less than or about 0.5 GPa, less than or about 0.1 GPa, less than or about 0.05 GPa, less than or about 0.01 GPa, less than or about −0.01 GPa, less than or about −0.1 GPa, less than or about −1 GPa, or less.

In embodiments, the deposition of the silicon-and-nitrogen-containing material on the substrate may be conducted at a deposition temperature that influences the deposition rate of the material. In additional embodiments, the semiconductor processing region of the processing chamber may be characterized by a deposition temperature less than or about 550° C., less than or about 500° C., less than or about 475° C., less than or about 450° C., less than or about 425° C., less than or about 400° C., less than or about 375° C., less than or about 350° C., or less than or about 300° C., or less. By depositing at temperatures below or about 500° C., the present technology may protect device thermal budgets compared to conventional, high-temperature depositions. In still additional embodiments, the silicon-and-nitrogen-containing material may be deposited at a deposition rate less than or about 20 Å/second, less than or about 15 Å/second, less than or about 12 Å/second, less than or about 10 Å/second, less than or about 8 Å/second, less than or about 5 Å/second, less than or about 2 Å/second, or less.

A discussed further below, embodiments of the deposition of the silicon-and-nitrogen-containing material may include all the material in the final silicon-and-nitrogen-containing layer, or a portion of the final silicon-and-nitrogen-containing layer that is less than the entire layer. In embodiments, a thickness of the as-deposited silicon-and-nitrogen-containing material on the substrate may be less than or about 500 Å, less than or about 400 Å, less than or about 350 Å, less than or about 300 Å, less than or about 250 Å, less than or about 200 Å, less than or about 150 Å, less than or about 100 Å, less than or about 50 Å, less than or about 40 Å, less than or about 30 Å, less than or about 20 Å, less than or about 15 Å, less than or about 10 Å, or less. In additional embodiments, the deposition operation may take less than or about 100 seconds, less than or about 75 seconds, less than or about 60 seconds, less than or about 30 seconds, less than or about 15 seconds, less than or about 10 seconds, less than or about 5 seconds, less than or about 2 seconds, less than or about 1 second, or less.

Embodiments of processing method 200 may additionally include flowing one or more treatment precursors into the substrate processing region of a substrate processing chamber 220. Embodiments of the treatment precursors may include a nitrogen-containing precursor such as $N_2$, and a noble gas precursor such as helium, argon, and neon. In some embodiments, the treatment precursors may be helium free. In additional embodiments, the treatment precursors may include some or all of the carrier gases that were also used as deposition precursors. For example, embodiments include a reduction or stoppage in the flow of the nitrogen-containing and silicon-containing deposition precursors used during the deposition operation while continuing to flow at least one of the carrier gases in the deposition precursors. In some embodiments, the flow rate of the carrier gases may be increased during the transition from the deposition operation to the treatment operation. In embodiments, the flow rate of the treatment precursors into the substrate processing region of the processing chamber may be greater than or about 20,000 sccm, greater than or about 22,500 sccm, greater than or about 25,000 sccm, greater than or about 27,500 sccm, greater than or about 30,000 sccm, or more. In additional embodiments, the treatment precursors may include molecular nitrogen ($N_2$) having a flow rate greater than or about 15,000 sccm, greater than or about 16,000 sccm, greater than or about 17,000 sccm, greater than or about 18,000 sccm, greater than or about 19,000 sccm, greater than or about 20,000 sccm, or more. The higher $N_2$ flow rates may form additional Si—N bonds in the silicon-and-nitrogen-containing material. In embodiments, the number of Si—N bonds in the treated silicon-and-nitrogen-containing material may be increased by greater than or about 1%, greater than or about 2%, greater than or about 3%, greater than or about 4%, greater than or about 5%, or more, compared to the as-deposited material. In further embodiments, the higher $N_2$ flow rates may reduce the etch rate of the treated silicon-and-nitrogen-containing material. In embodiments, the etch rate of the $N_2$-treated silicon-and-nitrogen-containing material may be reduced by greater than or about 1%, greater than or about 2%, greater than or about 5%, greater than or about 10%, greater than or about 15%. or more, compared to the as-deposited material.

In still more embodiments, the treatment precursors may include argon having a flow rate greater than or about 3000 sccm, greater than or about 4000 sccm, greater than or about 5000 sccm, greater than or about 6000 sccm, greater than or about 7000 sccm, greater than or about 8000 sccm, or more. In embodiments, the etch rate of the argon-treated silicon-and-nitrogen-containing material may be reduced by greater than or about 1%, greater than or about 2%, greater than or about 5%, greater than or about 10%, greater than or about 15%. or more, compared to the as-deposited material.

In additional embodiments, the flow of the treatment precursors into the substrate processing chamber may increase the pressure in the chamber. In some embodiments, the pressure in the processing chamber during the treatment operation may be greater than the pressure in the processing chamber during the deposition operation. In embodiments, the pressure in the substrate chamber during the flow of treatment precursors may be characterized as greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or more. In embodiments, an increased chamber pressure may increase the stress of the treated silicon-and-nitrogen-containing material. In some embodiments the increased chamber pressure may increase the stress in the treated silicon-and-nitrogen-containing material by greater than or about 2%, greater than or about 5%, greater than or about 10%, greater than or about 25%, greater than or about 50%. or more, compared to the as-deposited material. In additional embodiments, the increased chamber pressure may also increase an etch rate of the treated silicon-and-nitrogen-containing material. In embodiments, the increased chamber pressure may increase an etch rate in the treated silicon-and-nitrogen-containing material by greater than or about 1%, greater than or about 2%, greater than or about 5%, greater than or about 10%, greater than or about 25%. or more, compared to the as-deposited material.

In embodiments, the flow rate of the treatment precursors is greater than the flow rate of the deposition precursors. For example, in embodiments where the treatment precursors include one or more of the carrier gases in the deposition precursors, the flow rate of the one or more carrier gases in the treatment precursors is greater than the flow rate of the carrier gases in the deposition precursors. In embodiments, a flow rate ratio of the treatment precursors to deposition precursors may be greater than 1:1, greater than or about 1.25:1, greater than or about 1.5:1, greater than or about 1.75:1, greater than or about 2:1, or more. In embodiments where there is an increase in the precursor flow rate between the deposition and treatment operations, the tensile stress in the treated silicon-and-nitrogen-containing layer may be increased by a greater amount, and in a shorter period, than observed in conventional deposition-treatment methods.

Embodiments of processing method 200 may further include generating a treatment plasma in the substrate processing region of the processing chamber 225. The treatment plasma may be generated by delivering plasma power to the treatment precursors that have flowed into the substrate processing region. In some embodiments, the treatment plasma power may be delivered by the same source of radio frequency (RF) power, and through the same system electrodes, used to deliver the deposition plasma power. In additional embodiments, the treatment plasma power may be greater than the deposition plasma power that energizes the deposition plasma. In embodiments, the treatment plasma power may be greater than 60 Watts, greater than or about 70 Watts, greater than or about 80 Watts, greater than or about 90 Watts, greater than or about 100 Watts, greater than or about 110 Watts, greater than or about 120 Watts, greater than or about 130 Watts, greater than or about 140 Watts, greater than or about 150 Watts, or more. Increasing the plasma power may increase the dissociation and available radicals for bombardment and distribution within the film. In still further embodiments, the frequency of the RF power delivered to the treatment precursors may be 13.56 MHz in one non-limiting example. In some embodiments, the plasma power delivered to the treatment precursors may be supplied continuously, while in additional embodiments, the plasma power may be pulsed.

In some embodiments, the plasma power may be delivered as a continuous wave during the transition from the deposition to the treatment plasma. This may reduce the time for each dep-treat cycle to form the tensile-stressed, silicon-and-nitrogen-containing layer. In embodiments where several dep-treat cycles are performed to complete the formation of the layer, the cumulative reduction in processing time can be substantial. In further embodiments, the increase in plasma power during the treatment operation may also increase the tensile stress level in the fully-formed silicon-and-nitrogen-containing layer.

Embodiments of processing method 200 may further include treating the as-deposited silicon-and-nitrogen-containing material on the substrate in the substrate processing chamber with the treatment plasma 230. In some embodiments, the treatment plasma exposure time may be greater than or about 1 second, greater than or about 2 seconds, greater than or about 5 seconds, greater than or about 10 seconds, greater than or about 15 seconds, greater than or about 30 seconds, greater than or about 45 seconds, greater than or about 60 seconds, or more. In embodiments, the exposure time of the as-deposited silicon-and-nitrogen-containing material to the treatment plasma may depend on the thickness of the as-deposited material. In additional embodiments, the exposure time may be greater than or about 0.1 seconds per Angstrom of deposited material (0.1 sec/Å). In yet additional embodiments, the exposure time may be greater than or about 0.2 sec/Å, greater than or about 0.3 sec/Å, greater than or about 0.4 sec/Å, greater than or about 0.5 sec/Å, greater than or about 0.6 sec/Å, greater than or about 0.7 sec/Å, greater than or about 0.8 sec/Å, greater than or about 0.9 sec/Å, greater than or about 1 sec/Å, greater than or about 2 sec/Å, or more.

In embodiments, the treatment of the silicon-and-nitrogen-containing material on the substrate may be conducted at a treatment temperature that influences the treatment rate of the material. In additional embodiments, the semiconductor processing region of the processing chamber may be characterized by a treatment temperature less than or about 550° C., less than or about 500° C., less than or about 475° C., less than or about 450° C., less than or about 425° C., less than or about 400° C., less than or about 375° C., less than or about 350° C., or less than or about 300° C., or less. In some embodiments, an increased treatment temperature may decrease the atomic percentage of hydrogen in the treated silicon-and-nitrogen-containing material. In embodiments, the atomic percentage of hydrogen in the treated silicon-and-nitrogen-containing material may be reduced by greater than or about 1%, greater than or about 2.5%, greater than or about 5%, greater than or about 7.5%, greater than or about 10, or more, compared to the as-deposited material.

In embodiments, the treatment operation may produce a tensile silicon-and-nitrogen-containing material. In further embodiments, the treated silicon-and-nitrogen-containing material may have a tensile stress greater than or about 0.8 GPa, greater than or about 0.9 GPa, greater than or about 1 GPa, greater than or about 1.1 GPa, greater than or about 1.2 GPa, greater than or about 1.3 GPa, greater than or about 1.4 GPa, greater than or about 1.5 GPa, or more. In embodiments, the treatment operation may also produce a treated silicon-and-nitrogen-containing material having a reduced level of incorporated hydrogen. In embodiments, the amount of incorporated hydrogen in the treated material may be less than or about 3 at. %, less than or about 2 at. %, less than or about 1 at. %, less than or about 0.5 at. %, less than or about 0.2 at. %, less than or about 0.1 at. %, or less. The reduced amount of incorporated hydrogen in the treated silicon-and-nitrogen-containing material may contribute to the deposition of a material with increased tensile stress. In further embodiments, the reduced amount of incorporated hydrogen may also decrease the wet etch rate of the silicon-and-nitrogen containing layers.

In embodiments of the present technology, the plasma treatment operation on the as-deposited silicon-and-nitrogen-containing material within the deposition processing chamber eliminates the need to move the substrate to a UV treatment chamber and perform a UV treatment on the material. The elimination of the UV treatment operation reduces the complexity the processing methods and systems to form a tensile silicon-and-nitrogen-containing layer, as well as reducing the processing time. These and other aspects of the present technology provide faster, more productive, and more economical processing methods and systems to form tensile silicon-and-nitrogen-containing layers on semiconductor substrates.

The productivity increases achieved with embodiments of the present technology may be a cumulative increase for embodiments that form the silicon-and-nitrogen-containing layer in two or more cycles. These embodiments of processing method 200 may further include forming a tensile silicon-and-nitrogen-containing layer in two or more cycles of depositing and treating silicon-and-nitrogen-containing materials. The additional cycle may start with flowing additional deposition precursors into the substrate processing region of the substrate processing chamber, generating a deposition plasma from the deposition precursors 210, and depositing an additional portion of silicon-and-nitrogen containing material on the substrate. The additional cycle may also include flowing one or more treatment precursors into the substrate processing region of the processing chamber, generating a treatment plasma, and treating the as-deposited additional portion of the silicon-and-nitrogen-containing material to make an additional portion of a tensile silicon-and-nitrogen-containing layer.

When a portion of the tensile silicon-and-nitrogen-containing layer is formed, a determination may be made whether it completes the formation of the tensile silicon-and-nitrogen-containing layer 235. If the portion of the tensile silicon-and-nitrogen-containing layer completes the formation of the layer, then processing method may end 240. If the portion of the tensile silicon-and-nitrogen-containing layer does not complete the formation of the layer, then another cycle of depositing and treating silicon-and-nitrogen-containing materials may begin. In embodiments, a complete tensile silicon-and-nitrogen-containing layer may be formed when the thickness of the layer reaches greater than or about 50 Å, greater than or about 100 Å, greater than or about 150 Å, greater than or about 200 Å, greater than or about 250 Å, greater than or about 300 Å, greater than or about 400 Å, or more.

Embodiments of the completed, tensile silicon-and-nitrogen-containing layer made by processing method 200 may include a tensile stress level greater than or about 0.8 GPa, greater than or about 0.9 GPa, greater than or about 1 GPa, greater than or about 1.1 GPa, greater than or about 1.2 GPa, greater than or about 1.3 GPa, greater than or about 1.4 GPa, greater than or about 1.5 GPa, or more. In additional embodiments, the completed, tensile silicon-and-nitrogen-containing layer may have a wet etch rate less than or about 20 Å/min, less than or about 17.5 Å/min, less than or about 15 Å/min, less than or about 12.5 Å/min, less than or about 10 Å/min, or less. In embodiments, these characteristics of the tensile silicon-and-nitrogen-containing layer may make them effective silicon nitride etch stop layers or hardmasks that also provide support for the formation of precise openings in adjacent patterning materials. As noted above, the increased tensile stress in the nitride layer reduce the tendency of the adjacent patterning materials to etch at uneven rates during the formation of openings in the materials. Consequently, the openings formed in the patterning materials adjacent to the tensile nitride layer have less roughness, as characterized by the openings' reduced line edge roughness (LER) and line width roughness (LWR) along their sidewalls.

Figure 3A:
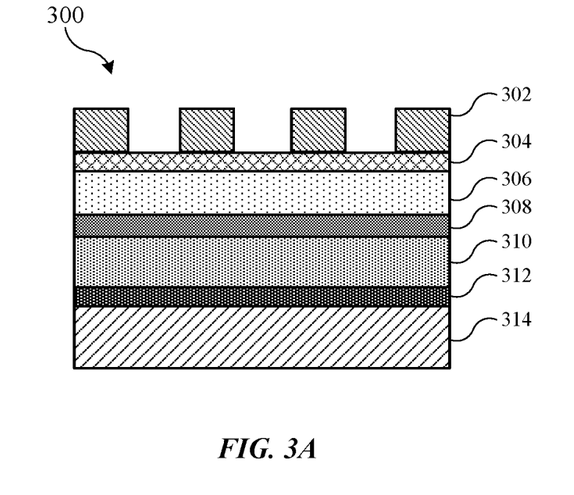
FIGS. 3A-B show a cross-sectional views of exemplary semiconductor structures according to some embodiments of the present technology.
Figure 3B:
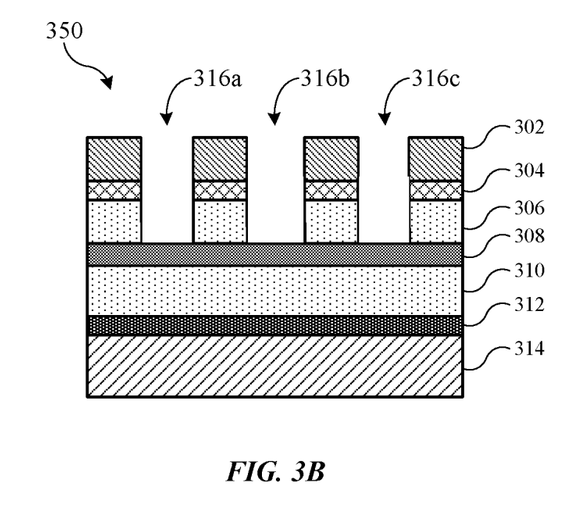

FIGS. 3A-B show cross-sectional views of an exemplary semiconductor structure 300 according to embodiments of the present technology. The embodiment shown in structure 300 includes a tensile silicon-and-nitrogen-containing layer 308 that is formed by the processing methods and systems according to embodiments of the present technology. In the embodiment shown in FIG. 3A, the structure 300 may also include a layer of patterned photoresist material 302 that is adjacent to first and second layers of patterning material 304 and 306. In the embodiment shown, the second layer of patterning material 306 is in direct contact with the tensile silicon-and-nitrogen-containing layer 308.

In the embodiment of structure 300 shown in FIG. 3A, layers are shown on an opposite side of the tensile silicon-and-nitrogen-containing layer 308 as the layers of patterned material 304 and 306. In embodiments, these layers on the side of layer 308 opposite the patterned material may include a dielectric layer 310 that may be in direct contact with the tensile silicon-and-nitrogen-containing layer 308. The dielectric layer may be characterized by a thickness greater than or about 800 Å, and may be characterized as a silicon-and-oxygen-containing dielectric layer, such as a silicon oxide layer. In further embodiments, the structure 300 may include a liner layer 312 adjacent to the dielectric layer 310. The liner layer 312 may be characterized by a thickness greater than or about 200 Å, and may be a dense layer of dielectric material, such as a silicon nitride layer deposited by atomic layer deposition. In still further embodiments, the structure 300 may include a polysilicon layer 314 adjacent to the liner layer 312. The polysilicon layer may be characterized by a thickness greater than or about 900 Å, and may act as a substrate for semiconductor device structures such as nMOS transistors (not shown).

In the embodiment of structure 300 shown in FIG. 3A, the patterned photoresist material 302 may be patterned to permit the formation of openings (not shown) in the first and second layers of patterning material 304 and 306. In embodiments, these openings may extend through the first layer of patterning material 304, which may be a silicon-oxygen-and-carbon-containing layer characterized by a thickness greater than or about 300 Å that may be formed by a spin-on process. In further embodiments, these openings may also extend through the second layer of patterning material 306, which may also be a silicon-oxygen-and-carbon-containing layer characterized by a thickness greater than or about 500 Å that may be formed by a chemical-vapor-deposition process. In additional embodiments, the tensile silicon-and-nitrogen-containing layer 308 may function as a etch-stop layer that can form a bottom side of the openings.

FIG. 3B shows another embodiment of structure 350 in which openings 316a-c are formed in the first and second layers of patterning material 304 and 306. These openings 316a-c may have sidewalls that are substantially perpendicular to a bottom side that includes an exposed surface of the tensile silicon-and-nitrogen-containing layer 308. The sidewalls of openings 316a-c may be characterized by a line edge roughness having an average deviation of less than or about 10 Å, less than or about 5 Å, less than or about 3 Å, less than or about 1 Å, or less. The LER/LWR values that characterize the sidewalls of the openings in the embodiments of structure 350 may be at least 10% less than LER/LWR values for openings formed in structures with a conventional, low-stress silicon nitride layer. The present processing methods and systems not only provide tensile silicon-and-nitrogen-containing layers without the need for time-consuming UV treatment operations, they also provide semiconductor structures like structure 350 where openings in the patterning material adjacent to the tensile silicon-and-nitrogen-containing layers are more precise and are characterized by decreased line edge roughness/line width roughness compared to openings formed in conventional structures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   flowing deposition gases comprising a nitrogen-containing precursor, a silicon-containing precursor, and a carrier gas, into a substrate processing region of a substrate processing chamber, wherein a flow rate ratio of the nitrogen-containing precursor to the silicon-containing precursor is greater than or about 1:1;
   generating a deposition plasma from the deposition gases to form a silicon-and-nitrogen-containing layer on a substrate in the substrate processing chamber; and
   treating the silicon-and-nitrogen-containing layer with a treatment plasma, wherein the treatment plasma increases a tensile stress of the treated portion of the silicon-and-nitrogen-containing layer, wherein the treatment plasma is formed from the carrier gas without the silicon-containing precursor, and wherein a flow rate of the carrier gas in the treatment plasma is greater than a flow rate of the carrier gas in the deposition plasma.

2. The semiconductor processing method of claim 1, wherein the nitrogen-containing precursor comprises ammonia, and wherein the ammonia has a flow rate greater than or about 100 sccm.

3. The semiconductor processing method of claim 1, wherein the silicon containing precursor comprises silane, and wherein the silane has a flow rate greater than or about 50 sccm.

4. The semiconductor processing method of claim 1, carrier gas comprises molecular nitrogen ($N_2$) and argon, wherein the molecular nitrogen has a flow rate greater than or about 5000 sccm, and the argon has a flow rate greater than or about 2000 sccm.

5. The semiconductor processing method of claim 1, wherein the silicon-and-nitrogen-containing layer is formed at a deposition rate less than or about 10 Å/second.

6. The semiconductor processing method of claim 1, wherein the generation of the deposition plasma further comprises delivering to the deposition gases a plasma power less than or about 60 Watts.

7. The semiconductor processing method of claim 1, wherein the substrate processing chamber is characterized by a deposition chamber pressure during the deposition of the silicon-and-nitrogen-containing layer that is less than the treatment chamber pressure during the treating of the silicon-and-nitrogen-containing layer.

8. The semiconductor processing method of claim 1, wherein a post-treatment silicon-and-nitrogen-containing layer comprises a silicon nitride layer characterized by a tensile stress greater than or about 1 GPa, and a wet etch rate less than or about 20 Å/minute.

9. A semiconductor processing method comprising:
   depositing a silicon-and-nitrogen-containing layer on a substrate in a substrate processing region of a substrate processing chamber, wherein the silicon-and-nitrogen-containing layer is deposited with a deposition plasma generated from a deposition gas comprising a nitrogen-containing precursor and a silicon-containing precursor, and wherein the deposition plasma is formed with a first plasma power; and
   treating the silicon-and-nitrogen-containing layer with a treatment plasma, wherein the treatment plasma increases a tensile stress of the treated portion of the silicon-and-nitrogen-containing layer, wherein the treatment plasma is formed with a second plasma power that is greater than the first plasma power, and wherein the silicon-and-nitrogen-containing layer is characterized by a tensile stress greater than or about 1 GPa, and a wet etch rate less than or about 20 Å/minute.

10. The semiconductor processing method of claim 9, wherein the first plasma power is less than or about 60 Watts and the second plasma power is greater than or about 100 Watts.

11. The semiconductor processing method of claim 9, wherein the silicon-and-nitrogen-containing layer comprises a silicon nitride layer with a hydrogen level less than or about 3 at. %.

12. The semiconductor processing method of claim 9, wherein the treatment plasma is formed from a treatment gas without the silicon-containing precursor or the nitrogen-containing precursor.

13. The semiconductor processing method of claim 9, wherein the treatment plasma is formed from a treatment gas comprising molecular nitrogen ($N_2$), and wherein the molecular nitrogen is delivered to the substrate processing chamber at a nitrogen flow rate greater than or about 10,000 sccm.

14. The semiconductor processing method of claim 9, wherein the silicon-and-nitrogen-containing layer is formed at a deposition rate less than or about 10 Å/second.

15. A semiconductor processing method comprising:
forming a silicon nitride layer, wherein the silicon nitride layer is formed by two or more cycles that comprise:
depositing a portion of a silicon nitride layer on a substrate in a substrate processing region of a substrate processing chamber, wherein the portion of the silicon nitride layer is deposited to a thickness less than or about 15 Å, and
treating the portion of the silicon nitride layer with a treatment plasma, wherein the treatment plasma increases a tensile stress and wet etch rate of the treated portion of the silicon nitride layer compared to the as-deposited portion, and wherein the treated portion of the silicon nitride layer is characterized by a hydrogen level less than or about 3 at. %.

16. The semiconductor processing method of claim 15, wherein the entire silicon nitride layer has a thickness greater than or about 300 Å.

17. The semiconductor processing method of claim 15, wherein the portion of the silicon nitride layer is treated with the treatment plasma for less than or about 15 seconds.

18. The semiconductor processing method of claim 15, wherein the portion of the silicon nitride layer is deposited from a deposition plasma that is generated from deposition gases delivered to the substrate processing chamber, and wherein the deposition gases comprise a nitrogen-containing precursor, a silicon-containing precursor, and further wherein the nitrogen containing precursor has a flow rate less than or about 200 sccm, and the silicon-containing precursor has a flow rate less than 100 sccm.

19. The semiconductor processing method of claim 15, wherein the portion of the silicon nitride layer is formed at a deposition rate less than or about 10 Å/second.

20. The semiconductor processing method of claim 15, wherein the entire silicon nitride layer is characterized by a tensile stress greater than or about 1 GPa, and a wet etch rate less than or about 20 Å/minute.

* * * * *